United States Patent
Xiang et al.

(12)

(10) Patent No.: US 6,214,683 B1
(45) Date of Patent: Apr. 10, 2001

(54) PROCESS FOR FABRICATING A SEMICONDUCTOR DEVICE COMPONENT USING LATERAL METAL OXIDATION

(75) Inventors: Qi Xiang, Santa Clara; Scott Allan Bell; Chih-Yuh Yang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/290,555

(22) Filed: Apr. 12, 1999

(51) Int. Cl.$^7$ ................................................ H01L 21/336
(52) U.S. Cl. ..................... 438/305; 438/265; 438/299; 438/431; 438/595; 438/634
(58) Field of Search ................................ 438/182, 265, 438/299, 303, 431, 448, 595, 634, 635, 636, 770, 305, 306, 740

(56) References Cited

U.S. PATENT DOCUMENTS 5,837,588 * 11/1998 Wu ........................................ 438/305
5,866,473 * 2/1999 Xiang et al. ........................... 438/585
6,046,090 * 11/1998 Wu ........................................ 438/303

* cited by examiner

*Primary Examiner*—Charles Bowers
*Assistant Examiner*—Jack Chen
(74) *Attorney, Agent, or Firm*—Brinks Hofer Gilson & Lione

(57) ABSTRACT

A process for fabricating a semiconductor device includes the formation of a hard-mask using lithographic techniques followed by a lateral oxidation process to reduce the lateral dimension of the hard-mask. The lateral oxidation is carried out by selectively oxidizing an oxidizable layer situated between an etch-stop layer and an oxidation resistant layer. Upon completion of the lateral oxidation process, etch-stop layer and the oxidation resistant are removed and a residual layer of oxidizable material is then used as a mask for the formation of a device component. The lateral dimension of the residual layer can be substantially less than that achievable by optical lithographic techniques.

19 Claims, 3 Drawing Sheets

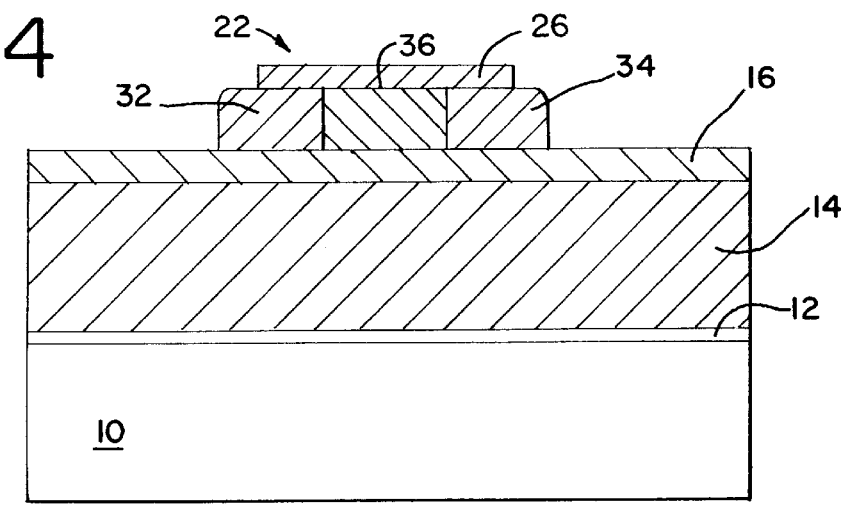
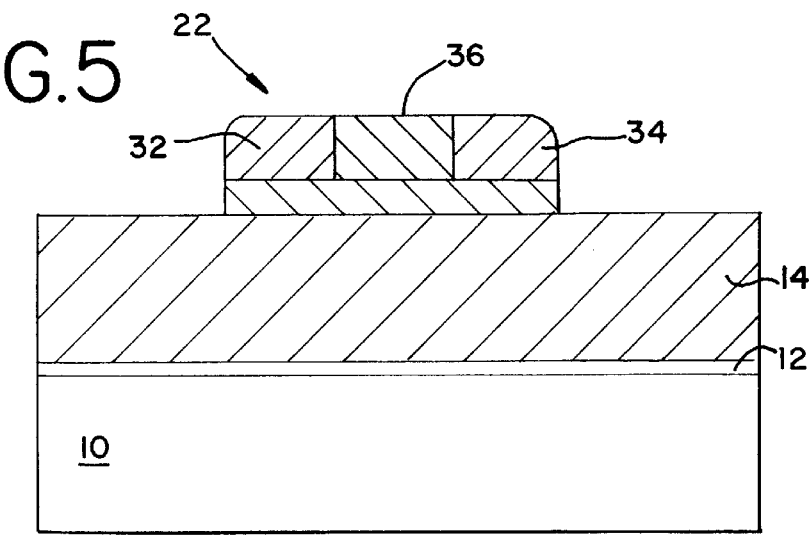
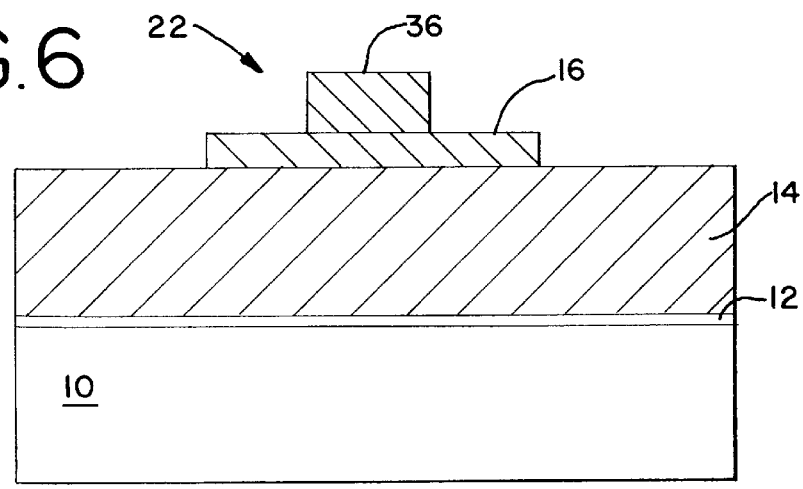

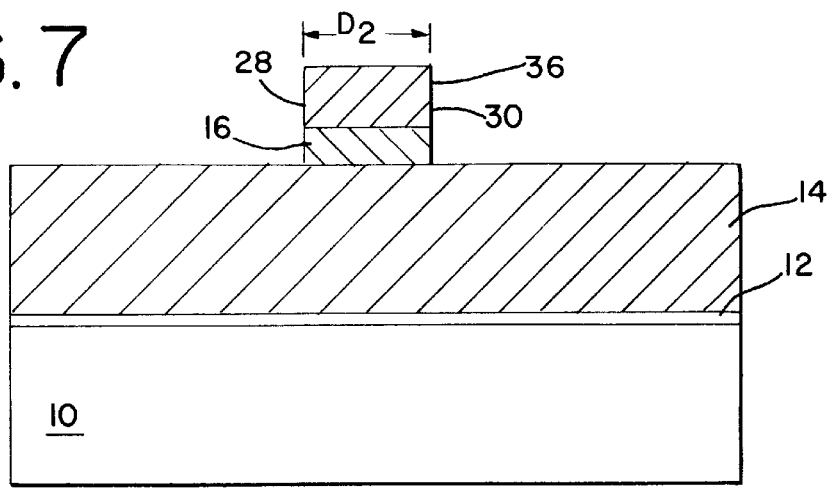
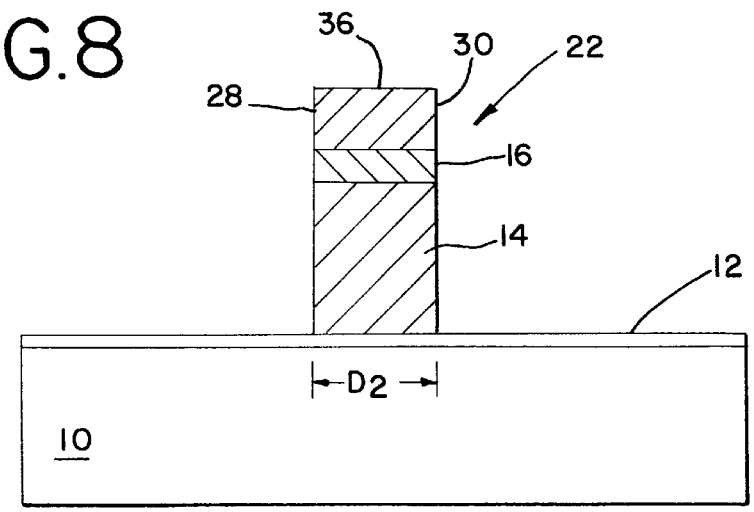
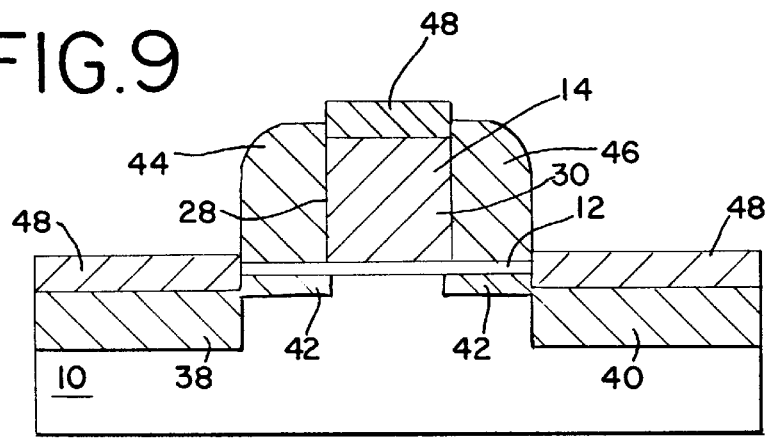

PROCESS FOR FABRICATING A SEMICONDUCTOR DEVICE COMPONENT USING LATERAL METAL OXIDATION

REFERENCE TO RELATED APPLICATIONS

Related subject matter is disclosed in the following commonly-assigned, co-pending patent applications filed on even date herewith:

| TITLE | APPLICATION SER. NO. |
|---|---|
| PROCESS FOR FABRICATING A SEMICONDUCTOR DEVICE COMPONENT BY OXIDIZING A SILICON HARD MASK | 09/290,088 |
| PROCESS FOR FABRICATING A SEMICONDUCTOR DEVICE COMPONENT USING A SELECTIVE SILICIDTION REACTION | 09/290,087 |
| PROCESS FOR FABRICATING A METAL SEMICONDUCTOR DEVICE COMPONENT BY LATERAL OXIDATION | 09/290,086 |

FIELD OF THE INVENTION

This invention relates, in general, to semiconductor device fabrication, and more particularly, to the fabrication of MOS transistors having sub-micron dimensions.

BACKGROUND OF THE INVENTION

There is a continuing trend in the semiconductor industry to fabricate integrated circuits of increasing complexity. As the complexity of an integrated circuit increases, the cost associated with fabricating the integrated circuit also increase. In order to provide integrated circuit devices having increased functional capability, while maintaining control over the cost associated with fabrication, more devices must be included on each semiconductor wafer. In recent years, integrated circuit fabrication technology has achieved the ability to define circuit components having feature sizes in the sub-microns size range. For example, new lithographic techniques have been developed using x-ray and deep UV energy sources. Additionally, film deposition technology now exist that can form thin-films having a precisely determined metallurgical composition and thickness. Furthermore, thin-film etching techniques have been developed which are capable of selectively etching one metallurgical composition, while not substantially etching other metallurgical compositions present on the semiconductor substrate.

However, even with the marked advances in fabrication technology, achievement of the necessary packing density and cost control in the manufacture of modern integrated circuits requires further processing innovations. This is because as device dimensions, such as the length of gate electrodes in metal-oxide-semiconductor (MOS) transistors, continue to be scaled to smaller dimensions new physical process limitations arise.

One major impediment to further size reduction of MOS transistors relates to the physical limitation of lithographic technology. Photolithographic techniques utilize an optically sensitive resist material that is formed on a semiconductor substrate. A photolithographic mask having a predetermined pattern is aligned to the semiconductor wafer and light is passed through the mask. After exposing the resist, the resist is developed to form a pattern on the wafer. The photoresist exposure steps typically require a difficult alignment of the mask with the wafer. In addition to alignment difficulty, the smallest feature size that can be photolithographically defined is limited by optical detraction. To reduce the amount of defraction in lithographic operations, manufacturers have resorted to the use of deep UV lithographic techniques to overcome some of the diffraction problems encountered using higher wave lengths of light. However, even deep UV lithography is not able to reliably define feature sizes of 0.1 microns and smaller.

To further enhance the performance of lithographic technology, manufacturers have developed advanced resist materials and coatings, such as antireflective coatings, and the like, to improve the ability of optical lithography to produce sub-micron features. Additionally, post-feature definition methods, such as photoresist trimming, are also used to reduce the feature size to dimensions below the photolithographic limit. Although advances in resist materials and processing methods have extended the limit of lithography to smaller dimensions, the precise formation of extremely small feature sizes remains beyond the ability of present process technology.

The fabrication of MOS transistors to have gate electrodes on the order of 0.1 microns requires processing technology beyond existing lithographic and resist formulation technologies. In many ways, the smallest feature size to which an MOS gate electrode can be fabricated governs the scaling of all other device components in an integrated circuit. The feature size of an MOS gate electrode must be continuously scaled down to improve the performance and operational capabilities of an integrated circuit. Accordingly, an improved fabrication process is necessary to reliably manufacture device components, such as MOS transistors having gate lengths on the order of 0.1 microns and smaller.

SUMMARY OF THE INVENTION

The present invention is for a process of fabricating a semiconductor device having feature sizes that are independent of lithographic limitations. In one embodiment, the process of the invention is advantageously used to fabricate the gate electrode of an MOS transistor. The lateral dimensions of the MOS gate electrode are initially defined by a lithographic process. However, the final lateral dimensions of the gate electrode are defined by laterally oxidizing portions of a hard-mask overlying the gate-forming layer. Once the oxidized portions are removed, the remaining unoxidized portion becomes the masking layer for the formation of the gate electrode. The process of the invention advantageously enables features on semiconductor devices to be fabricated to extremely small lateral dimensions, regardless of the capability of the lithographic system.

In one form, a semiconductor substrate is provided having a device component layer thereon. An etch-stop layer is formed to overlie the device component layer, and an oxidizable layer is formed to overlie the etch-stop layer. Then, an oxidation resistant layer is formed to overlie the oxidizable layer. The oxidation resistant layer and the oxidizable layer are processed to form a hard-mask having a first length. An oxidation process is then carried out to laterally oxidize the oxidizable layer leaving a residual layer having a second length. The second length is less than the first length. Following the oxidation process, the oxidation resistant layer is removed and the etch-stop layer and the device component layer are sequentially etched using the residual layer as an etching mask.

BRIEF DESCRIPTION OF THE DRAWING

FIGS. 1–9 illustrate processing steps in accordance with the invention.

Figure 1:
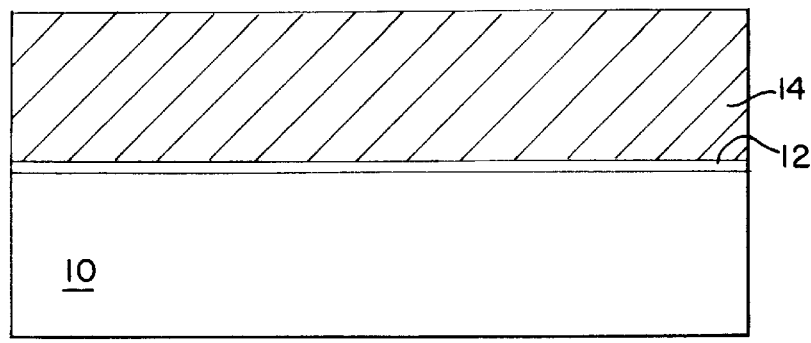

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PREFERRED EMBODIMENTS

FIGS. 1–9 illustrate processing steps in accordance with the invention for the fabrication of an MOS gate electrode. Although the illustrative embodiment of the invention is described with respect to the fabrication of an MOS gate electrode, those skilled in the art will appreciate that the process of the invention can be used to fabricate a wide variety of device components. For example, the process of the invention can be used to fabricate components, such as electrical leads, thin-film resistors, capacitors, and the like. Accordingly, the present invention contemplates the fabrication of all such device components and is not merely limited to the fabrication of MOS gate electrodes.

Shown in FIG. 1, in cross-section is a portion of a semiconductor substrate 10 having already undergone several processing steps in accordance with the invention. A gate dielectric layer 12 overlies an upper surface of semiconductor substrate 10. A gate layer 14 overlies gate dielectric layer 12. In the present embodiment, gate layer 12 is a material capable of forming a semiconductor gate electrode. Additionally, semiconductor substrate 12 is a substrate material capable of supporting an MOS transistor. Preferably, gate layer 14 is polycrystalline silicon or amorphous silicon conventionally deposited by chemical-vapor-deposition (CVD), and semiconductor substrate 10 is either single crystal silicon or epitaxial silicon, and gate dielectric layer 12 is silicon dioxide thermally grown on the surface of semiconductor substrate 10. Depending upon the particular type of MOS transistor to be fabricated, gate layer 14 can be doped with a conductivity determining dopant. Further, those skilled in the art will appreciate that gate layer 14 can be another material, such as a refractory metal, a refractory metal silicide, and the like. Additionally, semiconductor substrate 10 can be doped to have either a p-type or an n-type conductivity depending upon the particular conductivity of the MOS transistor being fabricated. Typical n-type dopants include phosphorus, arsenic, antimony, and the like, and typical p-type dopants include boron, and the like.

Figure 2:
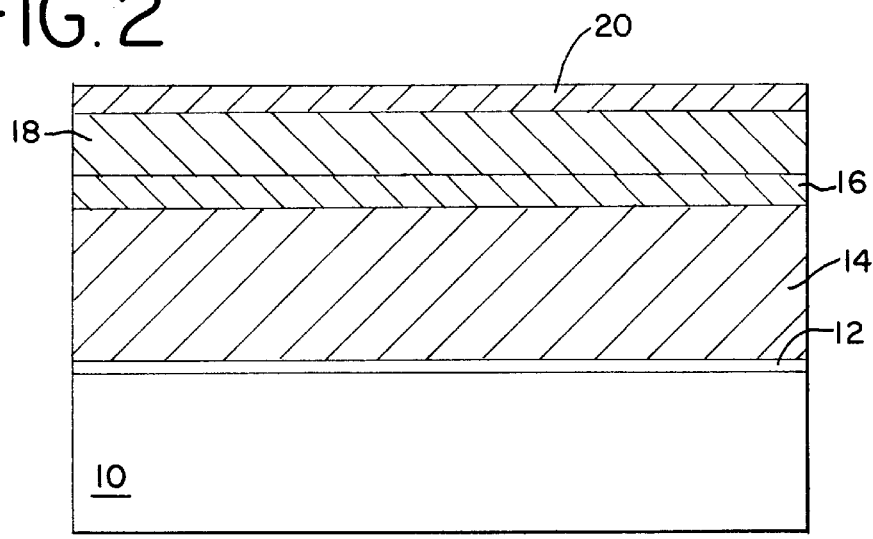

The inventive process continues, as illustrated in FIG. 2, with the formation of an etch-stop layer 16 overlying gate layer 14, and an oxidizable layer 18 is formed to overlie etch-stop layer 16. Preferably, etch-stop layer 16 is a material that is differentially etchable with respect to oxidizable layer 18. In one embodiment, etch-stop layer 16 is silicon nitride and oxidizable layer 18 is a metal. In a preferred embodiment of the invention, oxidizable layer 18 is aluminum (Al) or aluminum (Al) alloy, copper (Cu), cobalt (Co), tungsten (W), titanium (Ti), uranium (U), and the like, formed by either CVD or by physical-vapor-deposition (PVD) to a thickness of about 1000 to 2000 Å, and etch-stop layer 16 is silicon nitride formed to a thickness of about 500 to 1000 Å.

After forming oxidizable layer 18, an oxidation resistant layer 20 is formed to overlie oxidizable layer 18. In the preferred embodiment, where oxidizable layer 18 is a metal, oxidation resistant layer 20 is silicon oxynitride. Preferably, oxidation resistant layer 20 is deposited to a thickness of about 200 to 400 Å, and more preferably to a thickness of about 300 Å.

Figure 3:
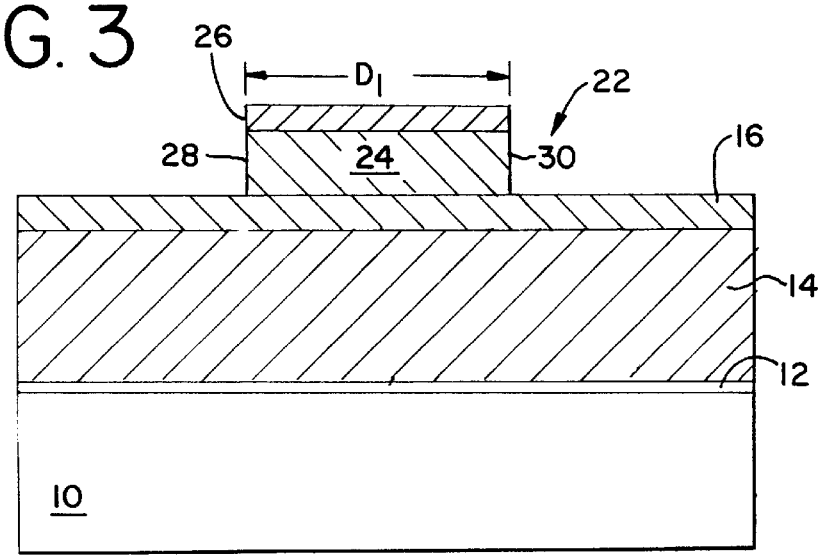

As illustrated in FIG. 3, oxidation resistant layer 20 and oxidizable layer 18 are processed to form a hard-mask 22. In one embodiment, hard-mask 22 is formed by a conventional lithographic process in which a resist layer (not shown) is deposited to overlie oxidation resistant layer 20 and lithographic processing is carried out to define a pattern having a lateral dimension ($D_1$). After forming the resist pattern, oxidation resistant layer 20 and oxidizable layer 18 are sequentially etched to form hard-mask 22 having the lateral dimension ($D_1$). Hard-mask 22 includes a portion 24 of oxidizable layer 18 and a cap layer 26 of oxidation resistant layer 20. Portion 24 includes a first edge 28 and a second edge 30.

After forming hard-mask 22, portion 24 is laterally oxidized, such that first and second edges 28 and 30 recede along the surface of etch-stop layer 16 as the oxidation process proceeds. As illustrated in FIG. 4, the oxidation process forms a first oxidized edge portion 32 and a second oxidized edge portion 34. The oxidation process leaves a residual layer 36 intermediate to first and second oxidized edge portions 32 and 34. The oxidation process selectively oxidizes portion 24 and does not substantially react with cap layer 26 or etch-stop layer 16. Because of the relatively low reactivity of cap layer 26 and etch-stop layer 16 with the oxidizing species, the oxidation process preferentially proceeds in a lateral direction, thereby reducing the amount of unoxidized material of portion 24. It is important to note that cap layer 26 prevents the oxidation of the upper portion of residual layer 36. Additionally etch-stop layer 16 prevents the oxidation of the lower portion of residual layer 36. Accordingly, first and second edges 28 and 30 of portion 24 are progressively displaced in a lateral direction toward each other. As described below, the lateral displacement of first and second edges 28 and 30 advantageously reduces the lateral dimension of hard-mask 22.

In a preferred embodiment, where portion 24 is a metal, such as described above, the oxidation process is carried out in an oxygen ambient at an elevated temperature. The oxidation process can be performed either by wet or dry thermal oxidation or by rapid-thermal-annealing (RTA). Preferably, the oxidation process is carried out at a relatively low temperature of about 700 to 1000° C.

Upon completion of the oxidation process, cap layer 26 is removed, as illustrated in FIG. 5. Preferably, cap layer 26 is removed by a selective, anisotropic dry etching process. The selective etching process preferentially etches the material of cap layer 26, while not substantially etching first and second oxidize edge portions 32 and 34 or residual layer 36. In a preferred embodiment of the invention, the selective etching process also removes portions of etch-stop layer 16 overlying portions of gate layer 14 exposed by hard-mask 22. In situations where cap layer 26 and etch-stop layer 16 are the same or highly similar materials, the selective etching process can utilize similar etching chemistry for removal of both cap layer 26 and expose portions of etch-stop layer 16. For example, where etch-stop layer 16 is a silicon nitride material and cap layer 26 is a silicon oxynitride, fluorinated hydrocarbon etch chemistry can be used to anisotropically etch both materials. Alternatively, anisotropic etching process can be used to selectively remove cap layer 26. Then, a selective anisotropic etching process can be used to remove exposed portions of etch-stop layer 16. The isotropic etching process can be carried out either by wet chemical processes, or alternatively, by isotropic dry etching techniques.

After removing cap layer 26 and exposed portions of etch-stop layer 16, first and second oxidized etch portions 32 and 34 are selectively etched away, as illustrated in FIG. 6. The removal of first and second oxidized edged portions 32 and 34 can be carried out with either a selective isotropic wet etching process, or a downstream isotropic plasma etching process. In a preferred embodiment, where oxidizable layer 18 is a metal, first and second oxidized edge portions 32 and 34 are a metal oxide. In this embodiment, hydroden fluoride etching chemistry is used to selectively remove the metal oxide, while not substantially etching residual layer 36 or gate layer 14. Etch-stop layer 16 provides an etch resistant layer for the isotropic etching process used to remove first and second oxidized edge portions 32 and 34. The material of etch-stop layer 16 is substantially non-reactive with the etching species used to etch away first and second oxidized edge portions 32 and 34.

Following the removal of first and second oxidized edge portions 32 and 34, portions of etch-stop layer 16 exposed by residual layer 36 are removed, as illustrated in FIG. 7. Preferably, etching is carried out by means of a reactive ion etching process (RIE), in which exposed portions of etch-stop layer 16 are anisotropically etched away. The anisotropic etching process is selective to etch-stop layer 16 and does not substantial etch either residual layer 36 or gate layer 14. In a preferred embodiment of the invention, where residual layer 36 is a metal, etch-stop layer 16 is silicon nitride, and gate layer 14 is polycrystalline silicon, fluorinated hydrocarbon etching chemistry is used to selectively etch away exposed portions of etch-stop layer 16. It is important to note that the primary hard-mask layer is etch-stop layer 16. Accordingly, some etching of residual layer 36 can be tolerated while etching gate layer 14.

Upon completion of the etching process, hard-mask 22 has a lateral dimension ($D_2$). The lateral distance $D_2$ between first and second edges 28 and 36 is substantially less than the lateral dimension $D_1$ originally defined by a lithographic process. The inventive process has advantageously reduced the lateral dimension of hard-mask 22 from a lithographically defined lateral dimension $D_1$ to a substantially smaller lateral dimension $D_2$. It is important to note that the reduced lateral dimension $D_2$ has been achieved without the use of a lithographic alignment process. In accordance with the invention, the dimension $D_2$ can be defined to values of about 0.1 microns and smaller. The ultimate lateral dimension achievable by the process of the invention is only limited by the oxidation characteristics and the control of deposition thicknesses of the various thin films comprising hard-mask 22. Those skilled in the art will appreciate that in many processing technologies the deposition thickness of thin-film materials can be controlled to high precision, while lithographic processes at 0.1 microns can only be controlled with great difficulty. Thus, the inventive process has provided a hard-mask 22 having a dimension $D_2$ that is substantially less than dimensions achievable by optical lithographic techniques.

Once hard-mask 22 is fabricated to have lateral dimension $D_2$, gate layer 14 is anisotropically etched using hard-mask 22 as an etch mask, as illustrated in FIG. 8. The etching process selectively removes exposed portions of gate layer 14, while not substantially etching gate dialectric layer 12. In a preferred embodiment of the invention, where gate layer 14 is polycrystalline silicon and gate dialectric layer 12 is silicon dioxide, chlorine and hydrogen bromide etching chemistry is used to selectively etch gate layer 14. The anisotropic etching process transfers the dimension $D_2$ from hard-mask 22 to gate layer 14. The RIE process is preferably carried out at low pressure and relatively high power. The RIE process can be carried out in a diode-type etching apparatus, or alternatively, in a magnetically enhanced RIE apparatus.

After fabricating gate layer 14 to a lateral dimension of $D_2$, subsequent processing is carried out to complete the fabrication of an MOS transistor. As illustrated in FIG. 9, source and drain regions 38 and 40 are formed in substrate 10. Additionally, source/drain extension regions 42 are also formed in substrate 10 and extend from source and drain regions 38 and 40 to the vicinity of first and second edges 28 and 30 of gate layer 14. Sidewall spacers 44 and 46 are formed overlying first and second edges 28 and 30, respectively. After forming sidewall spacers 44 and 46, silicide contact regions 48 are formed overlying source on drain regions 38 and 40 and gate layer 14. Those skilled in the art will recognize that the MOS transistor illustrated in FIG. 9 to incorporate many components typically found in submicron MOS transistors. Additionally, the MOS transistor illustrated in FIG. 9 can be either an n-type or a p-type depending on the conductivity of the dopants used to form source and drain regions 38 and 40 and source/drain extension regions 42. As described above, gate layer 14 can be a material dope with either p-type or n-type dopants. Further, gate layer 14 can be one of a number of gate-forming materials.

Thus, it is apparent that there has been disclosed a process for fabricating a semiconductor device component using lateral oxidation that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various thin-film deposition techniques, such as molecular beam deposition, metal-organic CVD, and the like, can be used. It is therefore intended to include within the invention all such variations and modifications as fall within the scope of the appended claims and equivalents thereof.

What is claimed is:

1. A process for fabricating a semiconductor device comprising the steps of:
   providing a semiconductor substrate having a gate layer overlying the semiconductor substrate and separated therefrom by a gate dielectric layer;
   forming an etch-stop layer overlying the gate layer;
   forming a composite hard-mask overlying the etch-stop layer,
      wherein the composite hard-mask includes a metal layer overlying the etch-stop layer and an oxidation resistant layer overlying the metal layer, and
      wherein the composite hard-mask has a first length;
   oxidizing the metal layer to form a metal layer having a second length,
      wherein the second length is less than the first length;
   removing the oxidation resistant layer; and
   removing portions of the etch-stop layer and the gate layer exposed by the metal layer.

2. The process of claim 1, wherein the step of oxidizing the metal layer comprises forming first and second oxidized edge portions of the metal layer separated by an unoxidized center portion.

3. The process of claim 2, further comprising the step of isotropically etching away the first and second oxidized edge portions of the metal layer.

4. The process of claim 2, wherein the step of oxidizing the metal layer comprises thermal oxidation at a temperature of about 700 to 1000° C.

5. The process of claim 2, wherein the step of oxidizing the metal layer comprises rapid thermal annealing in an oxidizing ambient at a temperature of about 700 to 1000° C.

6. The process of claim 1, wherein the step of removing portions of the etch-stop layer and the gate layer comprises reactive ion etching.

7. The process of claim 1, wherein the step of providing a gate layer comprises forming a layer selected from a group consisting of polycrystalline silicon and amorphous silicon.

8. The process of claim 1, wherein the step of forming an oxidation resistant layer comprises forming a layer of silicon oxynitride.

9. The process of claim 1, wherein the step of forming an etch-stop layer comprises forming a silicon nitride layer.

10. The process of claim 1, wherein the step of forming a composite hard-mask comprises forming a lithographic masking pattern on the oxidation resistant layer and anisotropically etching the oxidation resistant layer and the metal layer.

11. A process for fabricating a semiconductor device comprising the steps of:

providing a semiconductor substrate having a device component layer thereon;

forming an etch-stop layer overlying the device component layer;

forming an oxidizable layer overlying the etch-stop layer;

forming an oxidation resistant layer overlying the oxidizable layer;

etching the oxidation resistant layer and the oxidizable layer to form a hard-mask having a first length;

laterally oxidizing the oxidizable layer to form a residual layer having a second length, wherein the second length is less than the first length;

removing the oxidation resistant layer; and etching the etch-stop layer and the device component layer using the residual layer as an etching mask.

12. The process of claim 11, wherein the step of oxidizing the oxidizable layer comprises forming first and second oxidized edge portions of the oxidizable layer separated by an unoxidized center portion.

13. The process of claim 12, further comprising the step of isotropically etching away the first and second oxidized edge portions.

14. The process of claim 11, wherein the step of forming an oxidizable layer comprises forming a metal layer.

15. A process for fabricating a semiconductor device comprising the steps of:

providing a semiconductor substrate having a device component layer thereon;

forming an etch stop layer and an oxidizable metal layer overlying the etch stop layer;

forming an oxidation resistant layer overlying the oxidizable metal layer, wherein the etch stop layer, the oxidizable metal layer and the oxidation resistant layer form a composite hard-mask on the device component layer, wherein the composite hard-mask has a first and a second edge spaced apart by a first lateral dimension;

laterally oxidizing a portion of the hard-mask to reduce the first lateral dimension to a second lateral dimension, wherein the second lateral dimension is less than the first lateral dimension; and using the composite hard-mask to form a device component on the semiconductor substrate, the device component having the second lateral dimension.

16. The process of claim 15, wherein the step of forming a hard-mask comprises the steps of:

forming an etch-stop layer overlying the device component layer;

forming an oxidizable layer overlying the etch-stop layer;

forming an oxidation resistant layer overlying the oxidizable layer;

lithographically processing the oxidation resistant layer and the oxidizable layer to form the first and second edges.

17. The process of claim 16, wherein the step of laterally oxidizing a portion of the hard-mask comprises forming first and second oxidized edge portions of the metal layer separated by an unoxidized center portion.

18. The process of claim 15, wherein the step of providing a device component layer comprises forming, a layer selected from a group consisting of polycrystalline silicon and amorphous silicon.

19. The process of claim 15, wherein the step of using the hard-mask to form a device component comprises reactive ion etching.

* * * * *

UNITED STATES PATENT AND TRADEMARK OFFICE
CERTIFICATE OF CORRECTION

PATENT NO.   : 6,214,683 B1
DATED        : April 10, 2001
INVENTOR(S)  : Qi Xiang, Scott Allan Bell, and Chih-Yuh Yang It is certified that error appears in the above-identified patent and that said Letters Patent is hereby corrected as shown below:

Column 1,
Line 19, please replace the word "SILICIDTION" with -- SILICIDATION --.
Line 33, please replace the word "cost" with -- costs --.
Line 44, please replace the word "technology" with -- technologies --.

Column 2,
Line 3, please replace the word "detraction" with -- diffraction --.
Line 4, please replace the word "defraction" with -- diffraction --.

Column 5,
Line 7, please replace the word "hydroden" with -- hydrogen --.
Line 23, please replace the word "substantial" with -- substantially --.

Signed and Sealed this

Eighth Day of January, 2002

Attest:

Attesting Officer

JAMES E. ROGAN
Director of the United States Patent and Trademark Office